United States Patent
Huang et al.

(10) Patent No.: US 10,971,444 B2
(45) Date of Patent: Apr. 6, 2021

(54) VOLTAGE NOISE REDUCTION OF POWER DELIVERY NETWORKS FOR INTEGRATED CIRCUITS

(71) Applicant: Intel Corporation, Santa Clara, CA (US)

(72) Inventors: Jimmy Huat Since Huang, Georgetown (MY); Xingjian Cai, Palo Alto, CA (US); Paik Wen Ong, Taiping (MY); Herh Nan Chen, Georgetown (MY); Yun Ji, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 16/465,101

(22) PCT Filed: Nov. 29, 2017

(86) PCT No.: PCT/US2017/063717
§ 371 (c)(1),
(2) Date: May 29, 2019

(87) PCT Pub. No.: WO2018/125492
PCT Pub. Date: Jul. 5, 2018

(65) Prior Publication Data
US 2019/0326212 A1    Oct. 24, 2019

(30) Foreign Application Priority Data

Dec. 29, 2016  (MY) .......................... PI 2016704878

(51) Int. Cl.
*H01L 23/522*    (2006.01)
*H01L 23/498*    (2006.01)
(Continued)

(52) U.S. Cl.
CPC .... *H01L 23/5222* (2013.01); *H01L 23/49822* (2013.01); *H01L 23/50* (2013.01);
(Continued)

(58) Field of Classification Search
CPC ........... H01L 23/5222; H01L 23/49822; H01L 23/5023; H01L 23/5227; H01L 23/5289;
(Continued)

(56) References Cited

U.S. PATENT DOCUMENTS 7,109,755 B2   9/2006   Garmatyuk et al.
8,166,447 B1   4/2012   Smith et al.
(Continued)

OTHER PUBLICATIONS

International Search Report and Written Opinion dated Mar. 22, 2018 for International Patent Application No. PCT/US2017/063717, 10 pages.

*Primary Examiner* — Robert J Pascal
*Assistant Examiner* — Kimberly E Glenn
(74) *Attorney, Agent, or Firm* — Schwabe, Williamson & Wyatt, P.C.

(57) ABSTRACT

An electronic apparatus and an electronic system may include a first power delivery network (PDN) and a second PDN. The first PDN may include a first inductor as a segment of a power rail of the first PDN, while the second PDN may include a second inductor as a segment of a power rail of the second PDN. The first inductor and the second inductor may form a magnetically coupled inductor. The magnetically coupled inductor may provide migrated impedance $Z_T$ to the first PDN induced by the magnetically coupled inductor. The migrated impedance $Z_T$ to the first PDN may help the first PDN to reduce its voltage noise. Other embodiments may be described and/or claimed.

25 Claims, 7 Drawing Sheets

(51) Int. Cl.
    *H01L 23/50*     (2006.01)
    *H01L 23/528*    (2006.01)
    *H01L 23/66*     (2006.01)
    *H01L 27/06*     (2006.01)
    *H03H 7/01*      (2006.01)
    *H05K 1/02*      (2006.01)

(52) U.S. Cl.
    CPC ...... *H01L 23/5227* (2013.01); *H01L 23/5286* (2013.01); *H01L 23/66* (2013.01); *H01L 27/06* (2013.01); *H03H 7/01* (2013.01); *H05K 1/0231* (2013.01); *H05K 1/0237* (2013.01); *H05K 2201/049* (2013.01)

(58) Field of Classification Search
    CPC .............. H01L 23/66; H01L 27/06; H01L 2924/15311; H01L 224/16225; H03H 7/01; H05K 1/0231; H05K 1/0237; H05K 2201/049
    USPC ............................................ 333/12
    See application file for complete search history.

(56) References Cited

U.S. PATENT DOCUMENTS

| | | | |
|---|---|---|---|
| 8,466,662 B2 * | 6/2013 | Nania | H02J 7/35 323/207 |
| 2007/0279880 A1 | 12/2007 | Weir et al. | |
| 2013/0024831 A1 | 1/2013 | Budell et al. | |
| 2014/0268615 A1 | 9/2014 | Yun et al. | |
| 2015/0370944 A1 * | 12/2015 | Wang | G06F 30/367 716/132 |

* cited by examiner

VOLTAGE NOISE REDUCTION OF POWER DELIVERY NETWORKS FOR INTEGRATED CIRCUITS

CROSS REFERENCE TO RELATED APPLICATIONS

The present application is a national phase entry under 35 U.S.C. § 371 of International Application No. PCT/US2017/063717, filed Nov. 29, 2017, entitled "VOLTAGE NOISE REDUCTION OF POWER DELIVERY NETWORKS FOR INTEGRATED CIRCUITS", which claims priority to Malaysian Application PI 2016704878, filed Dec. 29, 2016, entitled "VOLTAGE NOISE REDUCTION OF POWER DELIVERY NETWORKS FOR INTEGRATED CIRCUITS." PCT/US2017/063717 designated, among the various States, the United States of America. The Specification of the PCT/US2017/063717 Application is hereby incorporated by reference.

TECHNICAL FIELD

The present disclosure relates to the field of electronic circuits. More particularly, the present disclosure relates to the voltage noise reduction of power delivery networks for integrated circuits.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

An integrated circuit (IC), often called a silicon chip, a computer chip, an IC chip, or a chip, may be a piece of silicon or another semiconductor into which an electronic circuit is etched using photographic techniques or other techniques. ICs may be produced in batches on a wafer. A wafer may be cut ("diced") into multiple dies. An IC, e.g., a die or a wafer, may be placed within a package. A package may be an interface between an IC and a printed circuit board (PCB). An electronic system or a computing device may be formed by electrically connecting various ICs included in packages that are assembled on a PCB, where the PCB may provide mechanical support to the electronic system.

A power distribution network (PDN) may deliver the power and the ground voltages through conductive power rails to ICs in an electronic system assembled on a PCB. A PDN may have static voltage noise and transient voltage noise. An excessive voltage noise of a PDN, e.g., a transient voltage noise, may reduce switching speeds and noise margins of ICs supplied by the PDN, which may lead to functional failures of the ICs. To reduce the voltage noise of a PDN, a conventional solution may add sufficient capacitance for each of the power rails of the PDN at all levels, e.g., on-die, in-package, and on-board of the PCB. Such a solution may use additional capacitors to achieve desired performance for the PDN, and hence may be very expensive. For example, the die size may be increased by including on-die capacitors, while the package form factor may be increased to allocate in-package capacitors for the PDN.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
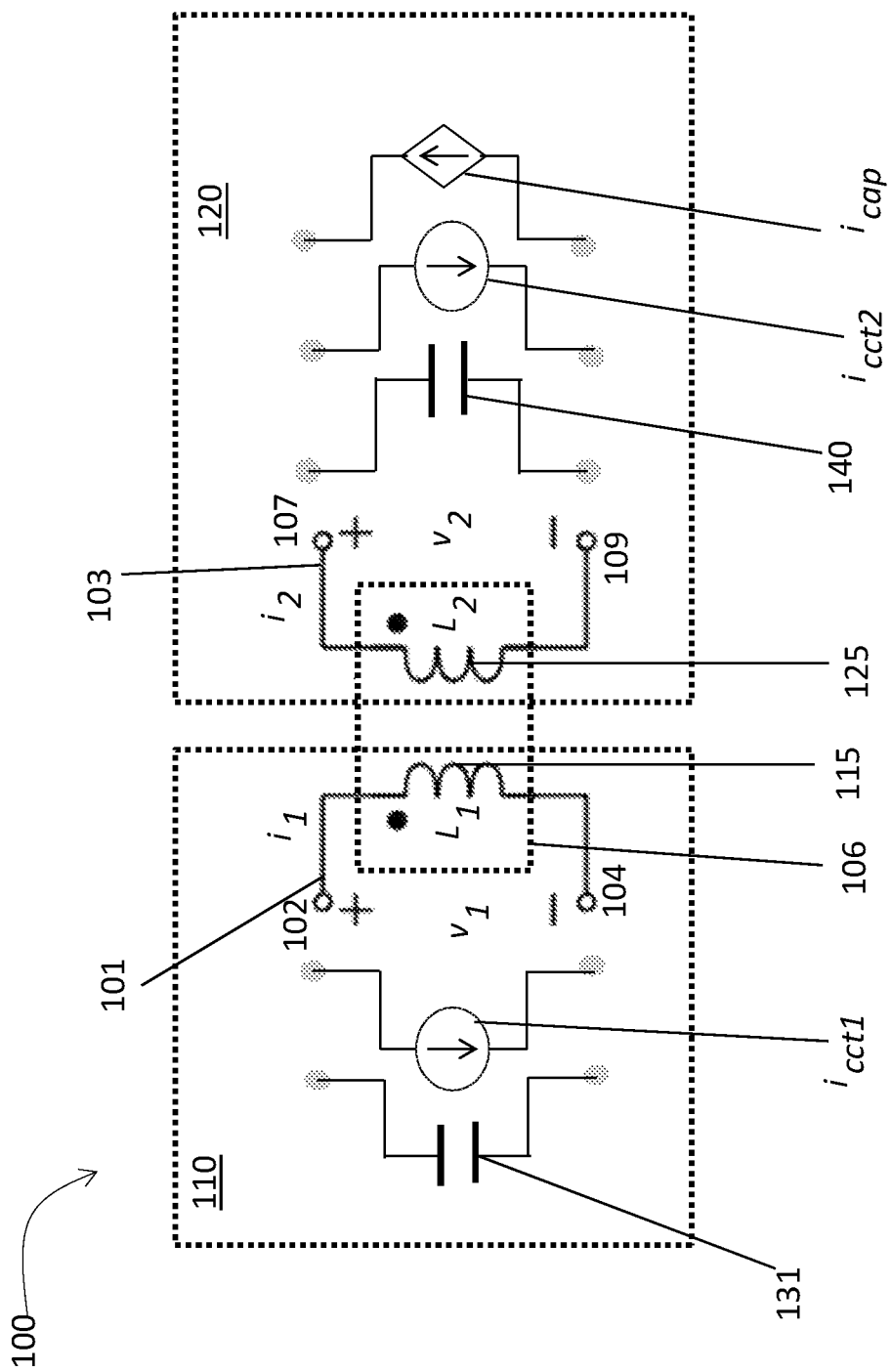
FIG. 1 illustrates a schematic view of an electronic apparatus having a first power delivery network (PDN) with a first inductor and a second PDN with a second inductor, according to various embodiments.

A power delivery network (PDN) may be an integrated part of an electronic system with various ICs included in packages that are assembled on a printed circuit board (PCB). A PDN may have a voltage noise, e.g., a static voltage noise or a transient voltage noise. In further descriptions herein, a voltage noise may simply refer to a transient voltage noise. The voltage noise $\Delta V$ of a PDN may be calculated by $\Delta V = Z * I_{cct}$, where $I_{cct}$ is the transient current of the PDN, and Z is the impedance associated with the PDN. A power integrity performance target of a PDN may be specified as an allowable voltage noise $\Delta V_T$ for the PDN. A PDN may meet a power integrity performance target $\Delta V_T$ if the voltage noise $\Delta V$ of the PDN is smaller than $\Delta V_T$.

A PDN with a higher capacitance may have a lower impedance Z, and hence a lower voltage noise $\Delta V = Z * I_{cct}$. Therefore, one way to reduce the voltage noise $\Delta V = Z * I_{cct}$ of a PDN to meet a power integrity performance target $\Delta V_T$ may be to reduce the impedance Z of the PDN, which may be achieved by increasing the capacitance associated with the PDN. To do so, the PDN may include additional capacitors added for the purpose of reducing the voltage noise $\Delta V$ of the PDN to meet a power integrity performance target $\Delta V_T$. The additional capacitors may be placed at various levels, e.g., on-die, in-package, or on-board of the PCB. However, the additional capacitors may increase the die size or the package form factor associated with the PDN.

In embodiments herein, an electronic system assembled on a PCB may include multiple PDNs, where one PDN may take advantage of the structure of another PDN to reduce its voltage noise $\Delta V$ with fewer or no additional capacitors. For example, a first PDN may include a first inductor, while a second PDN may include a second inductor. Moreover, the first inductor and the second inductor may form a magnetically coupled inductor, which may provide migrated impedance induced by the magnetically coupled inductor to the first PDN. The migrated impedance may reduce the overall impedance of the first PDN, hence reducing its voltage noise $\Delta V_1 = Z^* I_{cct}$ so that the first PDN may meet a power integrity performance target $\Delta V_{T1}$ with fewer or no additional capacitors.

In embodiments, an electronic apparatus may include a first PDN with a first capacitance, and a second PDN with a second capacitance. The first PDN may include a first inductor as a segment of a power rail of the first PDN, while the second PDN may include a second inductor as a segment of a power rail of the second PDN. In addition, the first inductor and the second inductor may form a magnetically coupled inductor. The magnetically coupled inductor may provide migrated impedance $Z_T$ to the first PDN induced by the magnetically coupled inductor. In embodiments, the second PDN with the second capacitance may have a second voltage noise $\Delta V_2$ smaller than a second power integrity performance target $\Delta V_{T2}$, and the first PDN with the first capacitance may have a first voltage noise $\Delta V_1$ larger than a first power integrity performance target $\Delta V_{T1}$. The migrated impedance $Z_T$ to the first PDN induced by the magnetically coupled inductor may help the first PDN to reduce the first voltage noise $\Delta V_1$ further to achieve a voltage noise $\Delta V_3$ smaller than the first power integrity performance target $\Delta V_{T1}$.

In embodiments, an electronic apparatus may include a substrate. A first inductor may be placed within the substrate, where the first inductor may be a segment of a power rail of a first PDN. A second inductor may be placed within the same substrate, where the second inductor may be a segment of a power rail of a second PDN. The first inductor and the second inductor may form a magnetically coupled inductor, which may provide migrated impedance to the first PDN. The migrated impedance to the first PDN may reduce the overall impedance of the first PDN, hence reducing its voltage noise to meet its power integrity performance target.

In some embodiments, an electronic system may include a PCB and a package substrate coupled with the PCB. The package substrate may include a first inductor and a second inductor, where the first inductor may be a segment of a power rail of a first PDN, and the second inductor may be a segment of a power rail of a second PDN. The first inductor and the second inductor may form a magnetically coupled inductor, which may provide migrated impedance to the first PDN. The migrated impedance to the first PDN may reduce the overall impedance of the first PDN, hence reducing its voltage noise to meet its power integrity performance target.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The description may use the phrase "communicatively coupled." The phrase may mean that an electrical signal may propagate among the elements that are communicatively coupled.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a schematic view of an electronic apparatus 100 having a first PDN 110 with a first inductor 115 and a second PDN 120 with a second inductor 125, according to various embodiments. The first inductor 115 and the second inductor 125 may form a magnetically coupled inductor 106, which may generate induced impedance for the first PDN 110. The induced impedance for the first PDN 110 may reduce its voltage noise.

In more detail, the electronic apparatus 100 may include the first PDN 110 that has a power rail 101 between a terminal 102 and a terminal 104. The first inductor 115 may be a segment of the power rail 101. The electronic apparatus 100 may also include the second PDN 120 that has a power rail 103 between a terminal 107 and a terminal 109. The second inductor 125 may be a segment of the power rail 103. There may be no direct current (DC) path between the first PDN 110 and the second PDN 120. For example, the first PDN and the second PDN may be disconnected electronically.

In embodiments, the first PDN 110 may include a first capacitance 131, which may include an intrinsic capacitance of the first PDN 110. In embodiments, the intrinsic capacitance of the first PDN 110 may include parasitic capacitance between metal wires, device capacitance of the non-switching devices, capacitance between N-well or P-well and substrate of transistors, or others. The first PDN 110 with the first capacitance 131 may have a first impedance $Z_1$. Therefore, the first PDN 110 with the first capacitance 131 may have a voltage noise $\Delta V_1 = Z_1 * i_{cct1}$ where $i_{cct1}$ is the transient current of the first PDN 110. In embodiments, when the first capacitance 131 includes only the intrinsic capacitance of the first PDN 110, the first capacitance 131 may not reduce enough impedance for the first PDN 110, hence the voltage noise $\Delta V_1 = Z_1 * i_{cct1}$ may be bigger than a power integrity performance target $\Delta V_{T1}$.

The second PDN 120 may include a second capacitance 140. In embodiments, the second capacitance 140 may include an intrinsic capacitance of the second PDN 120. In addition, the second capacitance 140 may also include decoupling capacitance added specifically for reducing the impedance of the second PDN 120. For example, the second capacitance 140 may include a capacitance of an on-die capacitor, a capacitance of an in-package capacitor, or a capacitance of an on-board capacitor, as shown in more details in FIGS. 2-5. The second PDN 120 with the second capacitance 140 may have a second impedance $Z_2$. Therefore, the second PDN 120 with the second capacitance 140 may have a voltage noise $\Delta V_2 = Z_2 * i_{cct2}$ where $i_{cct2}$ is the transient current of the second PDN 120. Due to the additional decoupling capacitance included in the second capacitance 140, the second impedance $Z_2$ may be low, and the voltage noise $\Delta V_2$ of the second PDN 120 may meet a power integrity performance target $\Delta V_{T2}$.

In embodiments, the first inductor 115 may have an inductance $L_1$ and the second inductor 125 may have an inductance $L_2$. The first inductor 115 and the second inductor 125 may form the magnetically coupled inductor 106. A coupling factor k between the first inductor 115 and the second inductor 125 may be greater than about 70%. In some other embodiments, the coupling factor k between the first inductor 115 and the second inductor 125 may be smaller or larger than 70%, depending on the application of the electronic apparatus 100. A mutual inductance M of the magnetically coupled inductor 106 may be $M = L_{12} = k\sqrt{L_1 * L_2}$.

In embodiments, the first PDN 110 may have a current $i_1$ and a voltage $V_1$. The second PDN 120 may have a current $i_2$ and a voltage $V_2$. The current $i_2$ may be a current for the second capacitance 140, which may be equivalent to a current $i_{cap}$ obtained as a sum of currents from capacitors at all levels included in the second capacitance 140, e.g., the intrinsic capacitance of the second PDN 120, an on-die capacitor, an in-package capacitor, an on-board capacitor, or others.

For the magnetically coupled inductor 106, the following equation holds, where $w = 2\pi f$, where f is the frequency:

$$\begin{bmatrix} v_1 \\ v_2 \end{bmatrix} = \begin{bmatrix} jwL_1 & jwM \\ jwM & jwL_2 \end{bmatrix} \begin{bmatrix} i_1 \\ i_2 \end{bmatrix}$$

Therefore the magnetically coupled inductor 106 may generate for the first PDN 110 an induced impedance $$Z_{12} = \frac{V_1}{i_1} = jwL_1 + jwM * \frac{i_2}{i_1},$$

where j represents the imaginary unit. The induced impedance $Z_{12}$ may further reduce the impedance of the first PDN, so that the voltage noise $\Delta V_1$ of the first PDN 110 may be further reduced to become a lower voltage noise $\Delta V_3$, e.g., $\Delta V_3 = (Z_1 - Z_{12}) * i_{cct1}$. In embodiments, when the induced impedance $Z_{12}$ is chosen properly, the voltage noise $\Delta V_3$ of the first PDN 110 may be smaller than the power integrity performance target $\Delta V_{T1}$.

The electronic apparatus 100 shown in FIG. 1 may be implemented in various embodiments. FIGS. 2-5 below illustrate various electronic systems as examples of the electronic apparatus 100.

Figure 2:
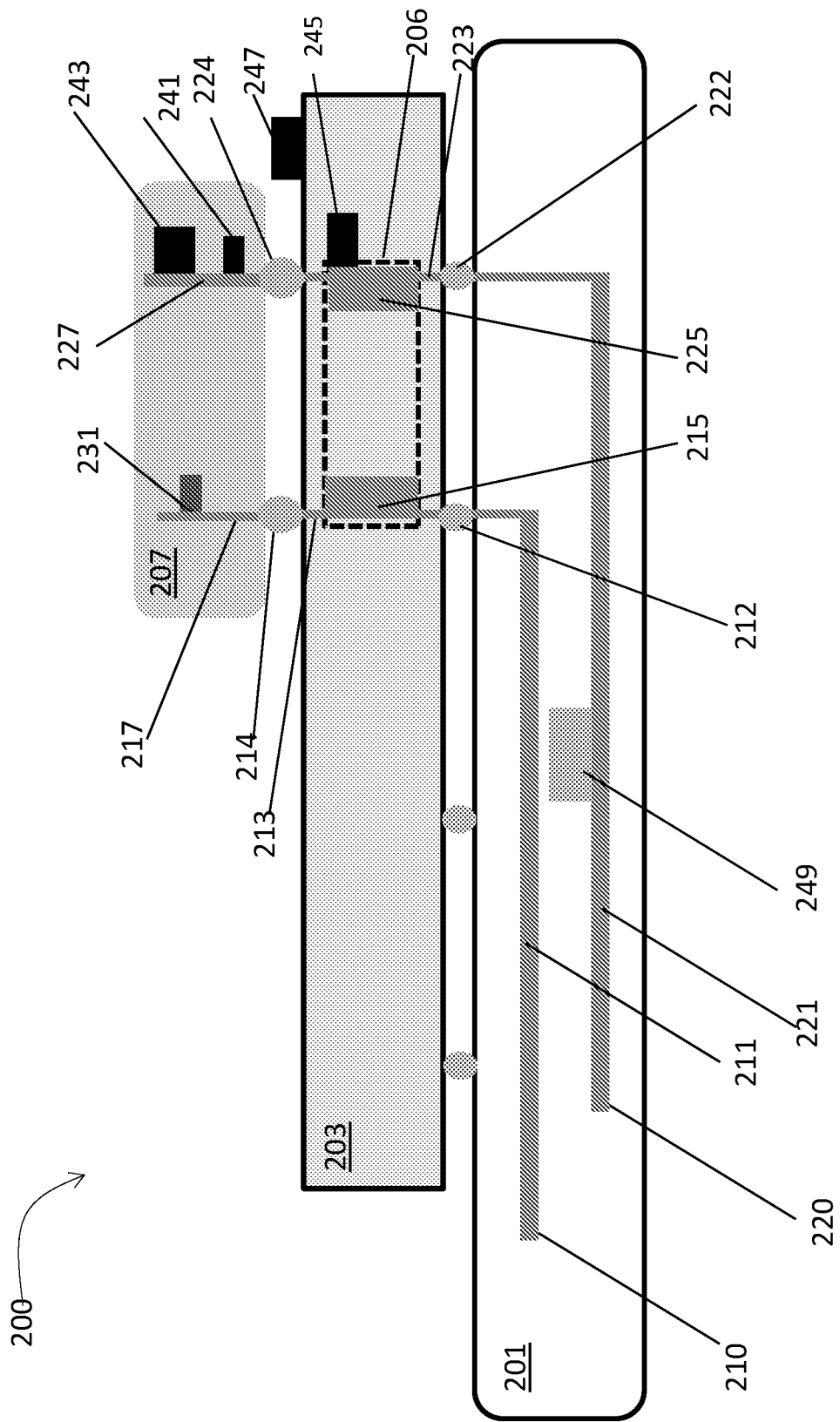
FIG. 2 illustrates a cross section view of an electronic system having a first PDN with a first inductor and a second PDN with a second inductor, according to various embodiments.

FIG. 2 illustrates a cross section view of an electronic system 200 having a first PDN 210 with a first inductor 215 and a second PDN 220 with a second inductor 225, according to various embodiments. In embodiments, the electronic system 200 may be an example of the electronic apparatus 100 shown in FIG. 1, where the first PDN 210 with the first inductor 215 may be an example of the first PDN 110 with the first inductor 115. Similarly, the second PDN 220 with the second inductor 225 may be an example of the second PDN 120 with the second inductor 125. The first inductor 215 and the second inductor 225 may form a magnetically coupled inductor 206, which may generate induced impedance $Z_T$ for the first PDN 210. The induced impedance $Z_T$ for the first PDN 210 may reduce its voltage noise.

In embodiments, the electronic system 200 may include a PCB 201, and a substrate 203 affixed to the PCB 201 by connectors, e.g., a connector 212 and a connector 222. Moreover, an IC 207 may be coupled to the substrate 203 by connectors, e.g., a connector 214 and a connector 224. The first inductor 215 and the second inductor 225 may be included within the substrate 203. The first PDN 210 and the second PDN 220 may run within the PCB 201, the substrate 203, and the IC 207, to provide power to the IC 207.

In embodiments, the electronic system 200 may be a system-on-chip (SoC) including one or more ICs, e.g., the IC 207, with multiple PDNs, e.g., the PDN 210 and the PDN 220. The form factor for the electronic system 200 may be getting smaller and smaller with the ongoing technology. Therefore, it is desirable to reduce the number of components and devices included in the electronic system 200 as much as possible. For example, by taking advantage of the induced impedance $Z_T$, and using fewer or no additional capacitors, the PDN 210 may have a voltage noise $\Delta V_1$ that may be smaller than the power integrity performance target $\Delta V_{T1}$.

In embodiments, the PCB 201 may include some type of PCB known to one having ordinary skill in the art. For example, the PCB 201 may be a rigid PCB or a flex PCB. In embodiments, the PCB 201 may contain components embedded in its substrate, not shown for simplicity reasons. Furthermore the PCB 201 may be single sided (one copper layer), double sided (two copper layers), multi-layer (outer and inner layers), and/or some combination thereof.

In embodiments, the substrate 203 may be a package substrate, which may be a polymeric substrate, or a non-polymeric substrate. Devices such as the IC 207 may be packaged onto the substrate 203. The IC 207 may be packaged onto the substrate 203 using a chip scale package (CSP), a wafer-level package (WLP), a quad-flat no-leads (QFN) package, a dual-flat no-leads (DFN) package, an area array device, or a package with overmold mounted on the PCB. A CSP may be a flip chip device including solder balls or bumps that are approximately 250 μm tall. A wafer-level package may be a package at a wafer level, instead of individual dies obtained from dicing them from a wafer. Both QFN and DFN packages may refer to packages that connect ICs to the surfaces of PCBs without through-holes.

In embodiments, the IC 207 may be a die, multiple dies, or a wafer. The IC 207 may include active devices, or passive components such as capacitors, resistors, or others. The IC 207 may include a central processing unit (CPU), a graphic processing unit (GPU), a memory chip, a phase-locked loop (PLL) chip, or an input/output (I/O) interface chip.

In embodiments, the PCB 201, the substrate 203, and the IC 207 may be coupled by connectors, e.g., the connector 212, the connector 214, the connector 222, and the connector 224. The connector 212 may be a stud, a wire-bonding wire, a bump, a ball, a solder pillar, or others. For example, the connector 212 may be a solder ball including solder alloy such as tin-lead (Sn—Pb) solders or lead free solders, e.g., Tin-Silver-Copper (Sn/Ag/Cu)).

In more detail, the first PDN 210 may include a first segment 211 contained within the PCB 201, a second segment 213 contained within the substrate 203, and a third segment 217 contained within the IC 207. The first inductor 215 may be included in the second segment 213. The first segment 211 and the second segment 213 may be coupled through the connector 212. The second segment 213 and the third segment 217 may be coupled through the connector 214. The first PDN 210 may include an intrinsic capacitance 231. In embodiments, the first PDN 210 may be without an on-die capacitor specifically for reducing the impedance of the first PDN 210.

Similarly, the second PDN 220 may include a first segment 221 contained within the PCB 201, a second segment 223 contained within the substrate 203, and a third segment 227 contained within the IC 207. The second inductor 225 may be included in the second segment 223. The first segment 221 and the second segment 223 may be coupled through the connector 222. The second segment 223 and the third segment 227 may be coupled through the connector 224. In embodiments, the second PDN 220 may include an intrinsic capacitance 241, an on-die capacitor 243 within the IC 207, an in-package capacitor 245 within the substrate 203, a capacitor 247 placed over a surface of the substrate, or an on-board capacitor 249 within the PCB 201.

The first inductor 215 and the second inductor 225 may form the magnetically coupled inductor 206 with a coupling factor k. The first inductor 215 may have an inductance $L_1$ and the second inductor 225 may have an inductance $L_2$. A mutual inductance of the magnetically coupled inductor 206 may be $L_{12}=k\sqrt{L_1 * L_2}$. When the current of the first PDN 210 is $i_1$, the voltage of the first PDN 210 is $V_1$, the current of the second PDN 220 is $i_2$, and the voltage of the second PDN 220 is $V_2$, the magnetically coupled inductor 106 may generate for the first PDN 210 an induced impedance $$Z_T = \frac{V_1}{i_1} = jwL_1 + jwM * \frac{i_2}{i_1}.$$

With the induced impedance $Z_T$, the first PDN 210 may have a voltage noise $\Delta V_1$ that may be smaller than the power integrity performance target $\Delta V_{T1}$, as demonstrated in the description for FIG. 1.

Figure 3:
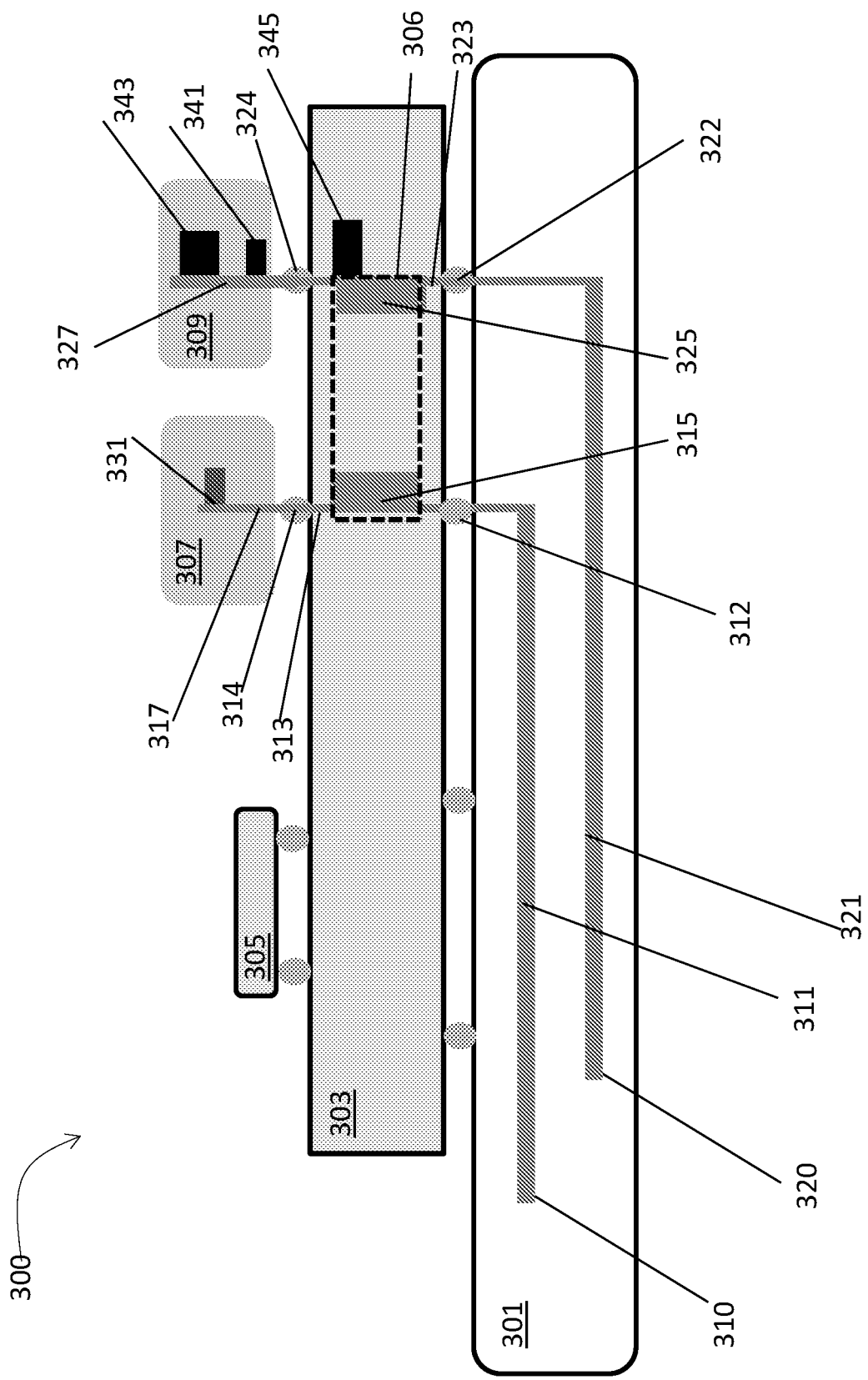
FIG. 3 illustrates a cross section view of another electronic system having a first PDN with a first inductor and a second PDN with a second inductor, according to various embodiments.

FIG. 3 illustrates a cross section view of another electronic system 300 having a first PDN 310 with a first inductor 315 and a second PDN 320 with a second inductor 325, according to various embodiments. In embodiments, the electronic system 300 may be an example of the electronic apparatus 100 shown in FIG. 1, where the first PDN 310 with the first inductor 315 may be an example of the first PDN 110 with the first inductor 115. Similarly, the second PDN 320 with the second inductor 325 may be an example of the second PDN 120 with the second inductor 125. The first inductor 315 and the second inductor 325 may form a magnetically coupled inductor 306, which may generate induced impedance $Z_T$ for the first PDN 310. The induced impedance $Z_T$ for the first PDN 310 may reduce its voltage noise.

In embodiments, the electronic system 300 may include a PCB 301, and a substrate 303 affixed to the PCB 301. The first inductor 215 and the second inductor 225 may be included within the substrate 303. The PCB 301 may be similar to the PCB 201 in FIG. 2, and the substrate 303 may be similar to the substrate 203 in FIG. 2.

There may be multiple ICs coupled to the substrate 303. For example, there may be an IC 305, an IC 307, and an IC 309 coupled to the substrate 303. In embodiments, the IC 305, the IC 307, or the IC 309 may be similar to the IC 207 in FIG. 2 and may include active devices, or passive components such as capacitors, resistors, or others. In some embodiments, the IC 307 may be different from the IC 309.

The first PDN 310 may run within the PCB 301, the substrate 303, and the IC 307, to provide power to the IC 307. Moreover, the second PDN 320 may run within the PCB 301, the substrate 303, and the IC 309, to provide power to the IC 309.

In more detail, the first PDN 310 may include a first segment 311 contained within the PCB 301, a second segment 313 contained within the substrate 303, and a third segment 317 contained within the IC 307. The first inductor 315 may be included in the second segment 313. The first segment 311 and the second segment 313 may be coupled through a connector 312. The second segment 313 and the third segment 317 may be coupled through a connector 314. The first PDN 310 may include an intrinsic capacitance 331. In embodiments, the first PDN 310 may be without an on-die capacitor specifically just for reducing the impedance of the first PDN 310.

Similarly, the second PDN 320 may include a first segment 321 contained within the PCB 301, a second segment 323 contained within the substrate 303, and a third segment 327 contained within the IC 309. The second inductor 325 may be included in the second segment 323. The first segment 321 and the second segment 323 may be coupled through a connector 322. The second segment 323 and the third segment 327 may be coupled through a connector 324. In embodiments, the second PDN 320 may include an intrinsic capacitance 341, an on-die capacitor 343 within the IC 309, or an in-package capacitor 345 within the substrate 303.

Figure 4:
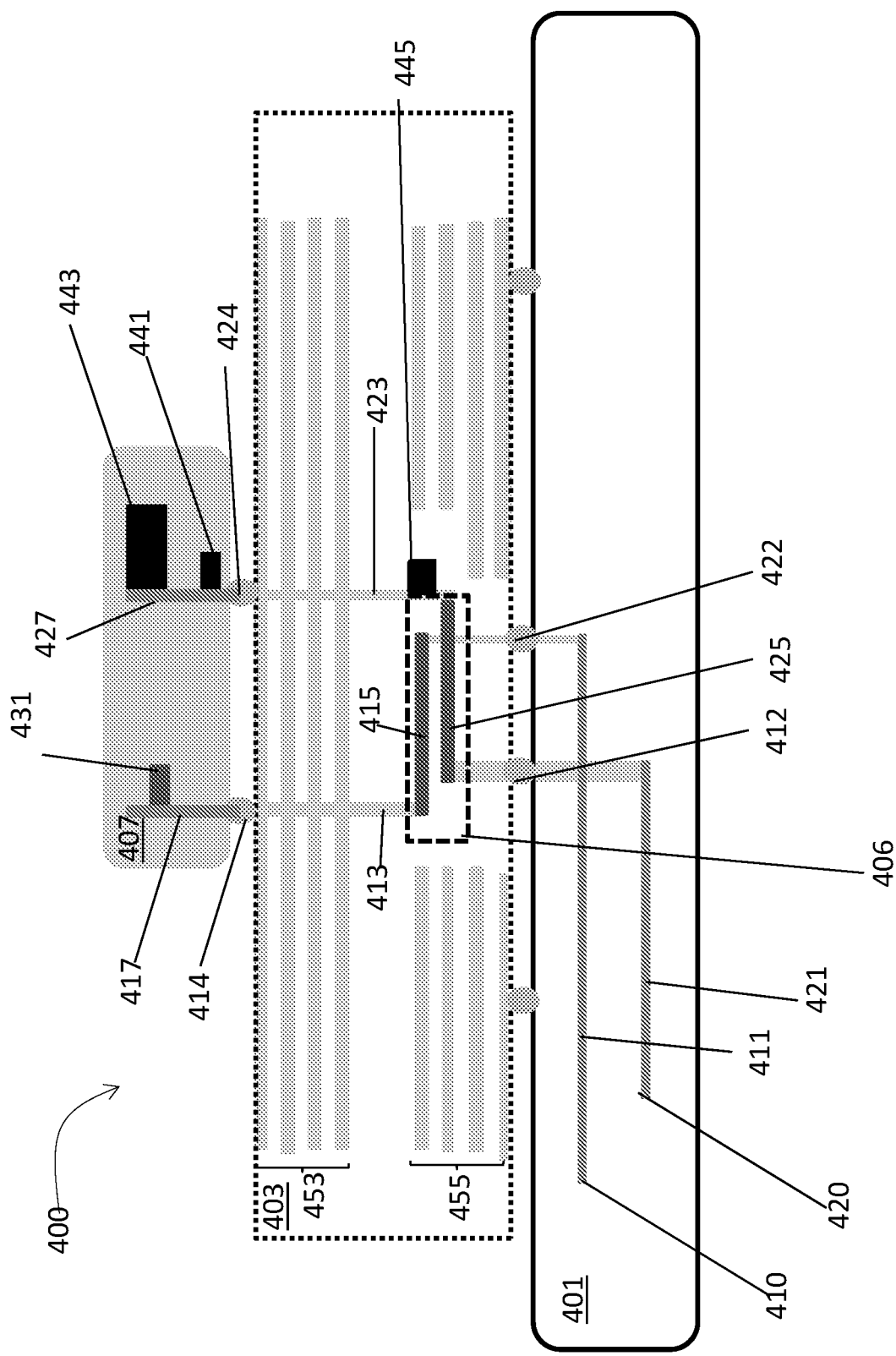
FIG. 4 illustrates a cross section view of another electronic system having a first PDN with a first inductor and a second PDN with a second inductor, according to various embodiments.

FIG. 4 illustrates a cross section view of another electronic system 400 having a first PDN 410 with a first inductor 415 and a second PDN 420 with a second inductor 425, according to various embodiments. In embodiments, the electronic system 400 may be an example of the electronic apparatus 100 shown in FIG. 1, where the first PDN 410 with the first inductor 415 may be an example of the first PDN 110 with the first inductor 115. Similarly, the second PDN 420 with the second inductor 425 may be an example of the second PDN 120 with the second inductor 125. The first inductor 415 and the second inductor 425 may form a magnetically coupled inductor 406, which may generate induced impedance $Z_T$ for the first PDN 410. The induced impedance $Z_T$ for the first PDN 410 may reduce its voltage noise.

In embodiments, the electronic system 400 may include a PCB 401, and a substrate 403 affixed to the PCB 401. The first inductor 415 and the second inductor 425 may be included within the substrate 403. Moreover, an IC 407 may be coupled to the substrate 403, at a side opposite to a side the PCB 401 and the substrate 403 are coupled. The first PDN 410 and the second PDN 420 may run within the PCB 401, the substrate 403, and the IC 407, to provide power to the IC 407. The PCB 401 may be similar to the PCB 201 in FIG. 2, the substrate 403 may be similar to the substrate 203 in FIG. 2, and the IC 407 may be similar to the IC 207 in FIG. 2.

In embodiments, the first PDN 410 may include a first segment 411 contained within the PCB 401, a second segment 413 contained within the substrate 403, and a third segment 417 contained within the IC 407. The first inductor 415 may be included in the second segment 413. The first segment 411 and the second segment 413 may be coupled through a connector 412. The second segment 413 and the third segment 417 may be coupled through a connector 414. The first PDN 410 may include an intrinsic capacitance 431. In embodiments, the first PDN 410 may be without an on-die capacitor specifically just for reducing the impedance of the first PDN 410.

Similarly, the second PDN 420 may include a first segment 421 contained within the PCB 401, a second segment 423 contained within the substrate 403, and a third segment 427 contained within the IC 407. The second inductor 425 may be included in the second segment 423. The first segment 421 and the second segment 423 may be coupled through a connector 422. The second segment 423 and the third segment 427 may be coupled through a connector 424. In embodiments, the second PDN 420 may include an intrinsic capacitance 441, an on-die capacitor 443 within the IC 407, an in-package capacitor 445 within the substrate 403. There may be other capacitors placed over a surface of the substrate 403, an on-board capacitors within the PCB 401, not shown for simplicity reasons.

In embodiments, the substrate 403 may include multiple layers, e.g., 10 layers. For example, some layers may form a first portion 453, and some other layers may form a second portion 455. In embodiments, the first portion 453 may include 5 layers, and the second portion 455 may also include 5 layers. The second portion 455 may be closer to the PCB 401, while the first portion 453 may be closer to the IC 407. The first inductor 415 and the second inductor 425 may be placed within the second portion 455. In some embodiments, the first inductor 415 and the second inductor 425 may be placed in a direction substantially parallel to a surface of the substrate 403. In some other embodiments, the first inductor 415 and the second inductor 425 may be placed in a direction substantially perpendicular to a surface of the substrate 403.

Figure 5:
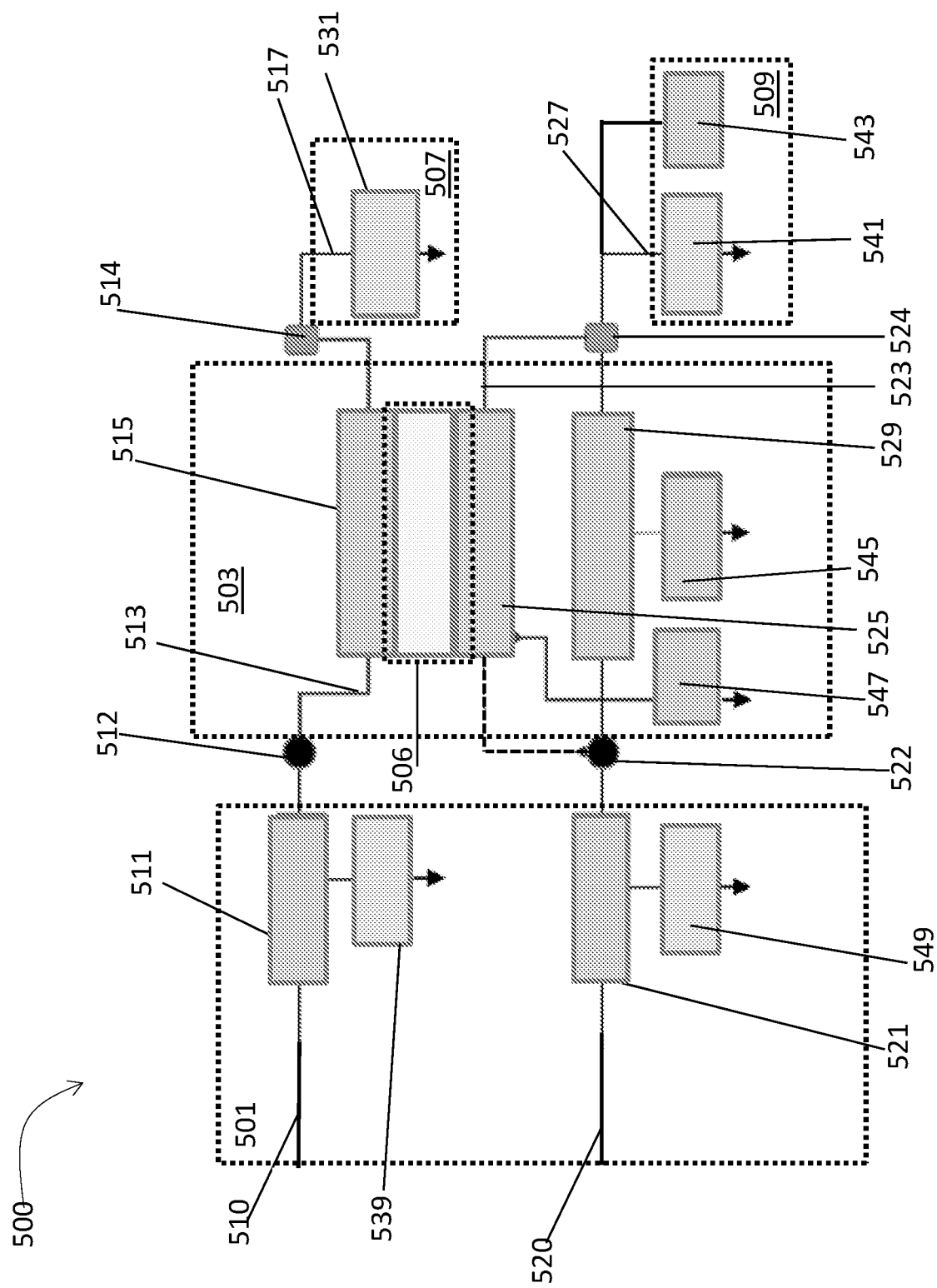
FIG. 5 illustrates a schematic view of an electronic system having a first PDN with a first inductor and a second PDN with a second inductor, according to various embodiments.

FIG. 5 illustrates a schematic view of another electronic system 500 having a first PDN 510 with a first inductor 515 and a second PDN 520 with a second inductor 525, according to various embodiments. In embodiments, the electronic system 500 may be an example of the electronic apparatus 100 shown in FIG. 1, where the first PDN 510 with the first inductor 515 may be an example of the first PDN 110 with the first inductor 115. Similarly, the second PDN 520 with the second inductor 525 may be an example of the second PDN 120 with the second inductor 125. The first inductor 515 and the second inductor 525 may form a magnetically coupled inductor 506, which may generate induced impedance $Z_T$ for the first PDN 510. The induced impedance $Z_T$ for the first PDN 510 may reduce its voltage noise.

In embodiments, the electronic system 500 may include a PCB 501, and a substrate 503 affixed to the PCB 501. The first inductor 515 and the second inductor 525 may be included within the substrate 503. Moreover, an IC 507 and an IC 509 may be coupled to the substrate 503. The first PDN 510 may run within the PCB 501, the substrate 503, and the IC 507, to provide power to the IC 507. The second PDN 520 may run within the PCB 501, the substrate 503, and the IC 509, to provide power to the IC 509. The PCB 501 may be similar to the PCB 201 in FIG. 2, the substrate 503 may be similar to the substrate 203 in FIG. 2, and the IC 507 or the IC 509 may be similar to the IC 207 in FIG. 2.

In embodiments, the first PDN 510 may include a first segment 511 contained within the PCB 501, a second segment 513 contained within the substrate 503, and a third segment 517 contained within the IC 507. The first inductor 515 may be included in the second segment 513. The first segment 511 and the second segment 513 may be coupled through a connector 512. The second segment 513 and the third segment 517 may be coupled through a connector 514. The first PDN 510 may include an intrinsic capacitance 531. In addition, the first PDN 510 may include a capacitor 539 within the PCB 501. In embodiments, the first PDN 510 may be without an on-die capacitor specifically just for reducing the impedance of the first PDN 510.

Similarly, the second PDN 520 may include a first segment 521 contained within the PCB 501, a second segment 523 contained within the substrate 503, and a third segment 527 contained within the IC 507. In addition, the second PDN 520 may include a fourth segment 529 within the substrate 503. The second segment 523 and the fourth segment 529 may be coupled in parallel within the substrate 503 to a connector 522 and a connector 524. In embodiments, the second segment 523 may be a high frequency rail connecting circuitry for high frequency applications, while the fourth segment 529 may be a low frequency rail connecting circuitry for low frequency applications. The second inductor 525 may be included in the high frequency rail, e.g., the second segment 523. The first segment 521 may be coupled to the second segment 523 and the fourth segment 529 through the connector 522. The third segment 527 may be coupled to the second segment 523 and the fourth segment 529 through the connector 524.

In embodiments, the second PDN 520 may include an intrinsic capacitance 541, an on-die capacitor 543 within the IC 509, an in-package capacitor 545 coupled to the fourth segment 529 within the substrate 503, an in-package capacitor 547 coupled to the second segment 523 within the substrate 503, and an on-board capacitor 549 within the PCB 501.

Figure 6:
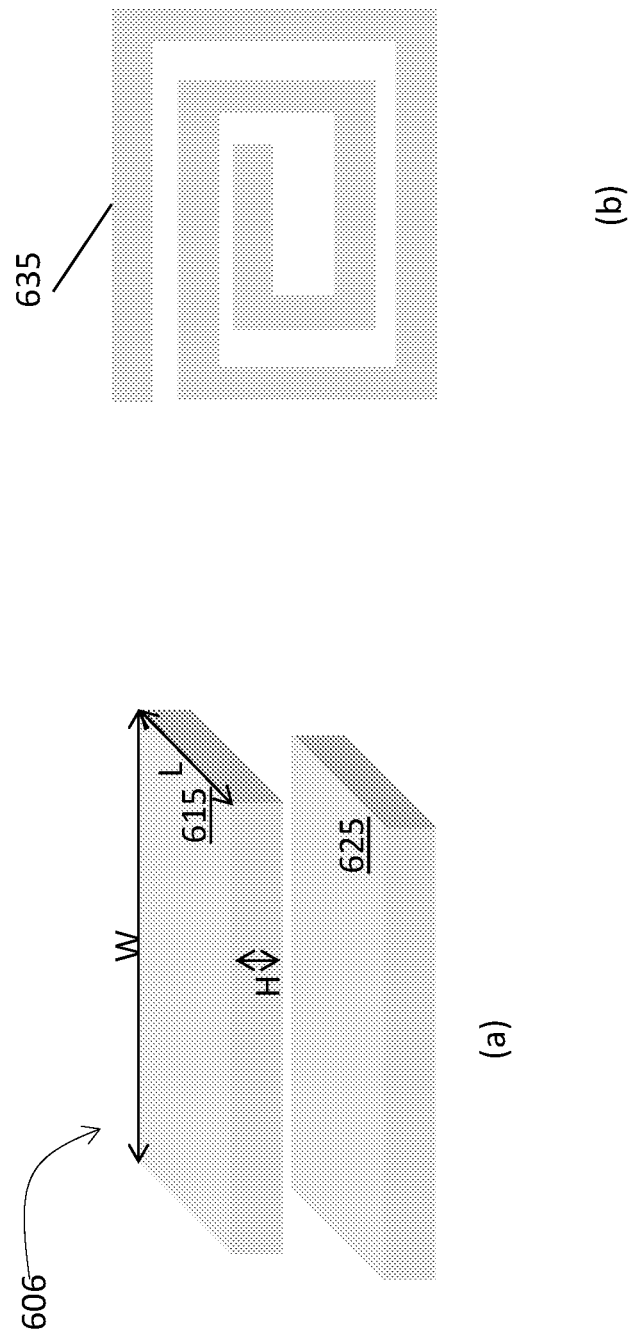
FIGS. 6(a)-6(b) illustrate a three-dimensional view and a top view of inductors used in a PDN, according to various embodiments.

FIGS. 6(a)-6(b) illustrate a three dimensional view and a top view of inductors used in a PDN, according to various embodiments.

FIG. 6(a) illustrates a magnetically coupled inductor 606 formed by a first inductor 615 and a second inductor 625. The magnetically coupled inductor 606 may be an example of the magnetically coupled inductor 106, the magnetically coupled inductor 206, the magnetically coupled inductor 306, the magnetically coupled inductor 406, or the magnetically coupled inductor 506.

In embodiments, the first inductor 615 or the second inductor 625 may include a rectangular plate having a width in a range of about 1.0 millimeter (mm) to about 1.5 mm, a length in a range of about 1.0 mm to 1.5 mm, and a height in a range of about 0.1 mm to 0.5 mm, relative to the surface of the substrate. The first inductor 115 or the second inductor 125 may include copper or aluminum.

In some other embodiments, the first inductor 615 or the second inductor 625 may be other shapes, sizes, or materials. For example, as illustrated in FIG. 6(b), an inductor 635 may be of a spiral shape. Furthermore, the inductor 635 may be of a triangular shape, a circular shape, a square shape, or others, not shown for simplicity reasons. The inductor 635 may be the first inductor 615 or the second inductor 625.

Figure 7:
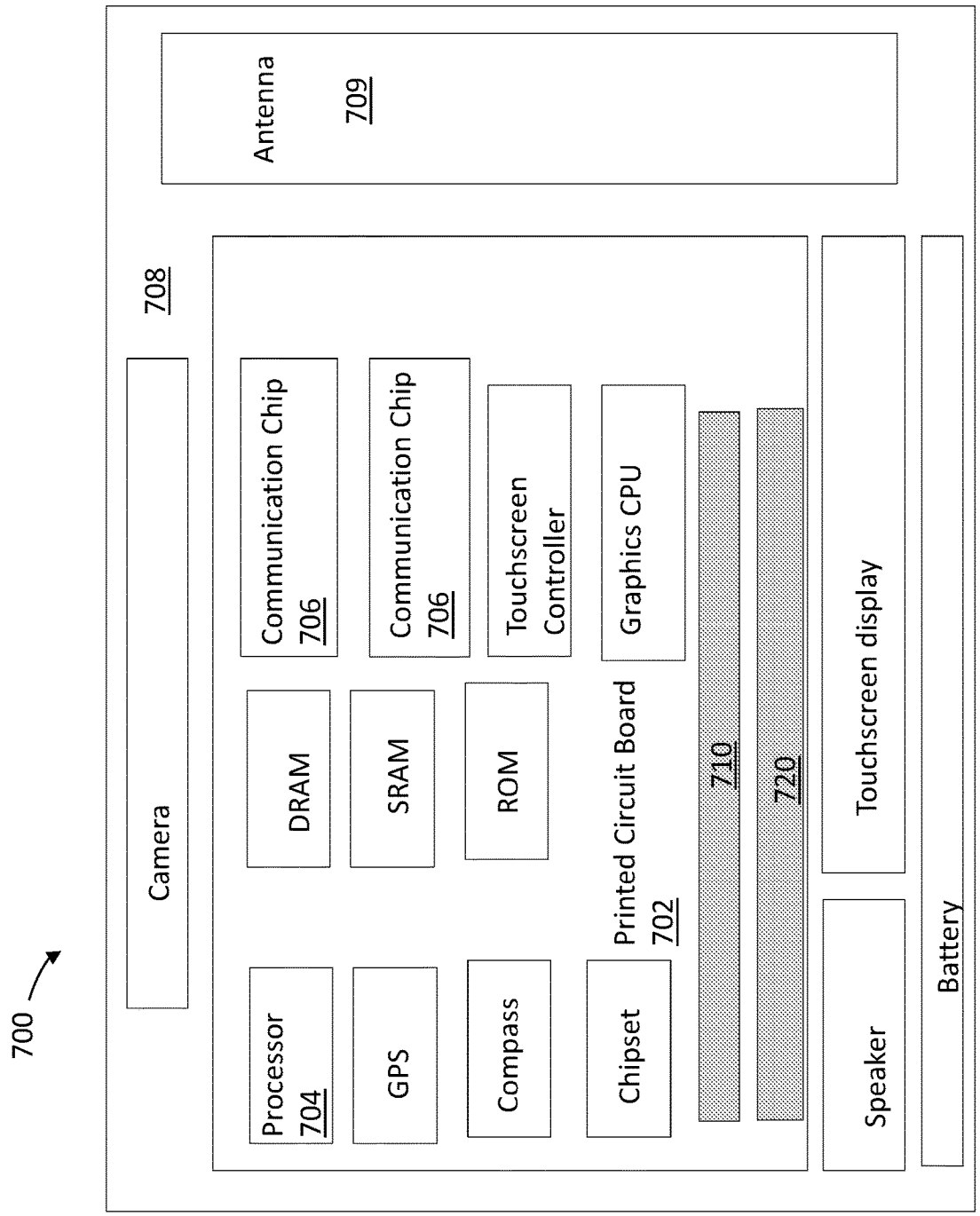
FIG. 7 illustrates a computing device in accordance with various embodiments described herein.

FIG. 7 illustrates a computing device 700 that may employ the apparatuses and/or methods described herein (e.g., an electronic system assembled on a PCB having a first PDN with a first inductor and a second PDN with a second inductor, as shown in FIG. 1), in accordance with various embodiments.

Components of the computing device 700 may be housed in an enclosure (e.g., housing 708). The PCB 702 may include a number of components, including but not limited to a processor 704 and at least one communication chip 706. The processor 704, which may be referred to as a central processing unit (CPU), may be physically and electrically coupled to the PCB 702. In some implementations, the at least one communication chip 706 may also be physically and electrically coupled to the PCB 702. In further implementations, the communication chip 706 may be part of the processor 704. In addition, the computing device 700 may further include an antenna 709 outside the PCB 702.

Depending on its applications, the computing device 700 may include other components that may or may not be physically and electrically coupled to the PCB 702. These other components may include, but are not limited to, a memory chip, which may be volatile memory, e.g., dynamic random access memory (DRAM), static random access memory (SRAM), non-volatile memory, e.g., read only memory (ROM), flash memory, a graphics central processing unit (CPU), a graphic processing unit (GPU), a phase-locked loop (PLL) chip, an input/output (I/O) interface chip, a digital signal processor (DSP), a crypto processor, a chipset, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

These components may be included in IC packages with substrates, e.g., the substrate 203, the substrate 303, the substrate 403, and the substrate 503. There may be a PDN 710 and a PDN 720 running within the PCB 702, the package substrates and the ICs. The PDN 710 and the PDN 720 may employ the PDN 210 and the PDN 220, the PDN 310 and the PDN 320, the PDN 410 and the PDN 420, or the PDN 510 and the PDN 520, as shown in FIGS. 2-5.

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, EV-DO, and others.

In various implementations, the computing device 700 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include an electronic apparatus, comprising: a first inductor, wherein the first inductor is a segment of a power rail of a first power delivery network (PDN) that has a first capacitance with a first voltage noise; and a second inductor, wherein the second inductor is a segment of a power rail of a second PDN, the second PDN has a second capacitance with a second voltage noise, wherein the first inductor and the second inductor form a magnetically coupled inductor, and wherein the first PDN includes an impedance induced by the magnetically coupled inductor to reduce the first voltage noise to a third voltage noise.

Example 2 may include the electronic apparatus of example 1 and/or some other examples herein, wherein the first voltage noise is larger than a first power integrity performance target, the second voltage noise is smaller than a second power integrity performance target, and the third voltage noise is smaller than the first power integrity performance target.

Example 3 may include the electronic apparatus of example 1 and/or some other examples herein, wherein the first inductor and the second inductor are included in a substrate.

Example 4 may include the electronic apparatus of example 3 and/or some other examples herein, wherein the substrate is a package substrate coupled with a printed circuit board (PCB), the first PDN includes a first segment of the first PDN within the PCB, a second segment of the first PDN within the substrate including the first inductor, and a third segment of the first PDN within a first integrated circuit (IC) coupled with the substrate, and wherein the second PDN includes a first segment of the second PDN within the PCB, a second segment of the second PDN within the substrate including the second inductor, and a third segment of the second PDN within a second IC coupled with the substrate.

Example 5 may include the electronic apparatus of example 4 and/or some other examples herein, wherein the first IC or the second IC is a central processing unit (CPU), a graphic processing unit (GPU), a memory chip, a phase-locked loop (PLL) chip, or an input/output (I/O) interface chip.

Example 6 may include the electronic apparatus of example 4 and/or some other examples herein, wherein the second capacitance includes an intrinsic capacitance of the second IC, a capacitance of an on-die capacitor within the second IC, a capacitance of a capacitor placed over a surface of the substrate, a capacitance of an in-package capacitor within the substrate, or a capacitance of an on-board capacitor within the PCB.

Example 7 may include the electronic apparatus of example 4 and/or some other examples herein, wherein the first capacitance includes an intrinsic capacitance of the first IC without an on-die capacitor within the first IC.

Example 8 may include the electronic apparatus of any of examples 1-7 and/or some other examples herein, wherein the substrate is the package substrate for a system-on-chip (SoC), the first IC and the PCB are placed at two opposite sides of the substrate, and wherein the substrate includes a plurality of layers, and the first inductor is included within a portion of the substrate closer to the PCB instead of the first IC.

Example 9 may include the electronic apparatus of any of examples 1-7 and/or some other examples herein, wherein the second PDN includes a high frequency rail and a low frequency rail, and wherein the second inductor is a segment of the high frequency rail of the second PDN.

Example 10 may include the electronic apparatus of any of examples 1-7 and/or some other examples herein, wherein there is no direct current (DC) path between the first PDN and the second PDN.

Example 11 may include the electronic apparatus of any of examples 1-7 and/or some other examples herein, wherein a coupling factor between the first inductor and the second inductor is greater than about 70%.

Example 12 may include the electronic apparatus of any of examples 1-7 and/or some other examples herein, wherein the first inductor includes a rectangular plate having a width relative to a surface of the substrate in a range of about 1.0 mm to 1.5 mm, a length relative to the surface of the substrate in a range of about 1.0 mm to 1.5 mm, and a height relative to the surface of the substrate in a range of about 0.1 mm to 0.5 mm.

Example 13 may include the electronic apparatus of any of examples 1-7 and/or some other examples herein, wherein the first inductor is of a triangular shape, a square shape, a rectangular shape, or a spiral shape.

Example 14 may include the electronic apparatus of any of examples 1-7 and/or some other examples herein, wherein the first inductor includes copper or aluminum.

Example 15 may include an electronic apparatus, comprising: a substrate; a first inductor placed within the substrate, wherein the first inductor is a segment of a power rail of a first power delivery network (PDN), and the first PDN has a first capacitance with a first voltage noise; and a second inductor placed within the substrate, wherein the second inductor is a segment of a power rail of a second PDN, the second PDN has a second capacitance with a second voltage noise, wherein the first inductor and the second inductor form a magnetically coupled inductor, and wherein the first PDN includes an impedance induced by the magnetically coupled inductor to reduce the first voltage noise to a third voltage noise.

Example 16 may include the electronic apparatus of example 15 and/or some other examples herein, wherein the substrate is a package substrate coupled with a printed circuit board (PCB), the first PDN includes a first segment of the first PDN within the PCB, a second segment of the first PDN within the substrate including the first inductor, and a third segment of the first PDN within a first integrated circuit (IC) coupled with the substrate, and wherein the second PDN includes a first segment of the second PDN within the PCB, a second segment of the second PDN within the substrate including the second inductor, and a third segment of the second PDN within a second IC coupled with the substrate.

Example 17 may include the electronic apparatus of example 16 and/or some other examples herein, wherein the second capacitance includes an intrinsic capacitance of the second IC, a capacitance of an on-die capacitor within the second IC, a capacitance of a capacitor placed over a surface of the substrate, a capacitance of an in-package capacitor within the substrate, or a capacitance of an on-board capacitor within the PCB.

Example 18 may include the electronic apparatus of any of examples 15-17 and/or some other examples herein, wherein the first capacitance includes an intrinsic capacitance of the first IC without an on-die capacitor within the first IC.

Example 19 may include the electronic apparatus of any of examples 15-17 and/or some other examples herein, wherein a coupling factor between the first inductor and the second inductor is greater than about 70%.

Example 20 may include the electronic apparatus of any of examples 15-17 and/or some other examples herein, wherein the first inductor includes a rectangular plate having a width relative to a surface of the substrate in a range of about 1.0 mm to 1.5 mm, a length relative to the surface of the substrate in a range of about 1.0 mm to 1.5 mm, and a height relative to the surface of the substrate in a range of about 0.1 mm to 0.5 mm.

Example 21 may include a computing device, comprising: a printed circuit board (PCB); a package substrate coupled with the PCB, wherein the package substrate includes a first inductor and a second inductor, and wherein the first inductor is a segment of a power rail of a first power delivery network (PDN), the first PDN has a first capacitance, and the first PDN with the first capacitance has a first voltage noise larger than a first power integrity performance target, and wherein the second inductor is a segment of a power rail of a second PDN, the second PDN has a second capacitance, and the second PDN with the second capacitance has a second voltage noise smaller than a second power integrity performance target, and wherein the first inductor and the second inductor form a magnetically coupled inductor, and the first PDN includes an impedance induced by the magnetically coupled inductor to reduce the first voltage noise to a third voltage noise.

Example 22 may include the computing device of example 21 and/or some other examples herein, wherein the first PDN includes a first segment of the first PDN within the PCB, a second segment of the first PDN within the package substrate including the first inductor, and a third segment of the first PDN within a first integrated circuit (IC) coupled with the package substrate, and wherein the second PDN includes a first segment of the second PDN within the PCB, a second segment of the second PDN within the package substrate including the second inductor, and a third segment of the second PDN within a second IC coupled with the package substrate.

Example 23 may include the computing device of any of examples 21-22 and/or some other examples herein, wherein the second capacitance includes an intrinsic capacitance of the second IC, a capacitance of an on-die capacitor within the second IC, a capacitance of a capacitor placed over a surface of the substrate, a capacitance of an in-package capacitor within the substrate, or a capacitance of an on-board capacitor within the PCB.

Example 24 may include the computing device of any of examples 21-22 and/or some other examples herein, wherein the first capacitance includes only an intrinsic capacitance of the first IC without an on-die capacitor within the first IC.

Example 25 may include the computing device of any of examples 21-22 and/or some other examples herein, wherein the first IC is different from the second IC.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An electronic apparatus, comprising:
a first inductor, wherein the first inductor is a segment of a power rail of a first power delivery network (PDN) that has a first capacitance with a first voltage noise; and
a second inductor, wherein the second inductor is a segment of a power rail of a second PDN, the second PDN has a second capacitance with a second voltage noise, wherein the first inductor and the second inductor form a magnetically coupled inductor, and wherein the first PDN includes an impedance induced by the magnetically coupled inductor to reduce the first voltage noise to a third voltage noise.

2. The electronic apparatus of claim 1, wherein the first voltage noise is larger than a first power integrity performance target, the second voltage noise is smaller than a second power integrity performance target, and the third voltage noise is smaller than the first power integrity performance target.

3. The electronic apparatus of claim 1, wherein the first inductor and the second inductor are included in a substrate.

4. The electronic apparatus of claim 3, wherein the substrate is a package substrate coupled with a printed circuit board (PCB), the first PDN includes a first segment of the first PDN within the PCB, a second segment of the first PDN within the substrate including the first inductor, and a third segment of the first PDN within a first integrated circuit (IC) coupled with the substrate, and wherein the second PDN includes a first segment of the second PDN within the PCB, a second segment of the second PDN within the substrate including the second inductor, and a third segment of the second PDN within a second IC coupled with the substrate.

5. The electronic apparatus of claim 4, wherein the first IC or the second IC is a central processing unit (CPU), a graphic processing unit (GPU), a memory chip, a phase-locked loop (PLL) chip, or an input/output (I/O) interface chip.

6. The electronic apparatus of claim 4, wherein the second capacitance includes an intrinsic capacitance of the second IC, a capacitance of an on-die capacitor within the second IC, a capacitance of a capacitor placed over a surface of the substrate, a capacitance of an in-package capacitor within the substrate, or a capacitance of an on-board capacitor within the PCB.

7. The electronic apparatus of claim 4, wherein the first capacitance includes an intrinsic capacitance of the first IC without an on-die capacitor within the first IC.

8. The electronic apparatus of claim 4, wherein the substrate is the package substrate for a system-on-chip (SoC), the first IC and the PCB are placed at two opposite sides of the substrate, and wherein the substrate includes a plurality of layers, and the first inductor is included within a portion of the substrate closer to the PCB instead of the first IC.

9. The electronic apparatus of claim 3, wherein the first inductor includes a rectangular plate having a width relative to a surface of the substrate in a range of about 1.0 mm to 1.5 mm, a length relative to the surface of the substrate in a range of about 1.0 mm to 1.5 mm, and a height relative to the surface of the substrate in a range of about 0.1 mm to 0.5 mm.

10. The electronic apparatus of claim 1, wherein the second PDN includes a high frequency rail and a low frequency rail, and wherein the second inductor is a segment of the high frequency rail of the second PDN.

11. The electronic apparatus of claim 1, wherein there is no direct current (DC) path between the first PDN and the second PDN.

12. The electronic apparatus of claim 1, wherein a coupling factor between the first inductor and the second inductor is greater than about 70%.

13. The electronic apparatus of claim 1, wherein the first inductor is of a triangular shape, a square shape, a rectangular shape, or a spiral shape.

14. The electronic apparatus of claim 1, wherein the first inductor includes copper or aluminum.

15. An electronic apparatus, comprising:
a substrate;
a first inductor placed within the substrate, wherein the first inductor is a segment of a power rail of a first power delivery network (PDN), and the first PDN has a first capacitance with a first voltage noise; and
a second inductor placed within the substrate, wherein the second inductor is a segment of a power rail of a second PDN, the second PDN has a second capacitance with a second voltage noise,
wherein the first inductor and the second inductor form a magnetically coupled inductor, and
wherein
the first PDN includes an impedance induced by the magnetically coupled inductor to reduce the first voltage noise to a third voltage noise.

16. The electronic apparatus of claim 15, wherein the substrate is a package substrate coupled with a printed circuit board (PCB), the first PDN includes a first segment of the first PDN within the PCB, a second segment of the first PDN within the substrate including the first inductor, and a third segment of the first PDN within a first integrated circuit (IC) coupled with the substrate, and wherein the second PDN includes a first segment of the second PDN within the PCB, a second segment of the second PDN within the substrate including the second inductor, and a third segment of the second PDN within a second IC coupled with the substrate.

17. The electronic apparatus of claim 16, wherein the second capacitance includes an intrinsic capacitance of the second IC, a capacitance of an on-die capacitor within the second IC, a capacitance of a capacitor placed over a surface of the substrate, a capacitance of an in-package capacitor within the substrate, or a capacitance of an on-board capacitor within the PCB.

18. The electronic apparatus of claim 16, wherein the first capacitance includes an intrinsic capacitance of the first IC without an on-die capacitor within the first IC.

19. The electronic apparatus of claim 15, wherein a coupling factor between the first inductor and the second inductor is greater than about 70%.

20. The electronic apparatus of claim 15, wherein the first inductor includes a rectangular plate having a width relative to a surface of the substrate in a range of about 1.0 mm to 1.5 mm, a length relative to the surface of the substrate in a range of about 1.0 mm to 1.5 mm, and a height relative to the surface of the substrate in a range of about 0.1 mm to 0.5 mm.

21. A computing device, comprising:
a printed circuit board (PCB);
a package substrate coupled with the PCB, wherein the package substrate includes a first inductor and a second inductor, and wherein the first inductor is a segment of a power rail of a first power delivery network (PDN), the first PDN has a first capacitance, and the first PDN with the first capacitance has a first voltage noise larger than a first power integrity performance target, and wherein the second inductor is a segment of a power rail of a second PDN, the second PDN has a second capacitance, and the second PDN with the second capacitance has a second voltage noise smaller than a second power integrity performance target, and wherein the first inductor and the second inductor form a magnetically coupled inductor, and the first PDN includes an impedance induced by the magnetically coupled inductor to reduce the first voltage noise to a third voltage noise.

22. The computing device of claim 21, wherein the first PDN includes a first segment of the first PDN within the PCB, a second segment of the first PDN within the package substrate including the first inductor, and a third segment of the first PDN within a first integrated circuit (IC) coupled with the package substrate, and wherein the second PDN includes a first segment of the second PDN within the PCB, a second segment of the second PDN within the package substrate including the second inductor, and a third segment of the second PDN within a second IC coupled with the package substrate.

23. The computing device of claim 22, wherein the second capacitance includes an intrinsic capacitance of the second IC, a capacitance of an on-die capacitor within the second IC, a capacitance of a capacitor placed over a surface of the package substrate, a capacitance of an in-package capacitor within the substrate, or a capacitance of an on-board capacitor within the PCB.

24. The computing device of claim 22, wherein the first capacitance includes only an intrinsic capacitance of the first IC without an on-die capacitor within the first IC.

25. The computing device of claim 22, wherein the first IC is different from the second IC.

* * * * *